United States Patent
Kameda et al.

(10) Patent No.: US 6,538,896 B2
(45) Date of Patent: Mar. 25, 2003

(54) SURFACE MOUNT TYPE ELECTRONIC COMPONENT

(75) Inventors: Eitaro Kameda, Toyama (JP); Toshiyuki Baba, Moriyama (JP); Hideaki Kuroda, Toyama-ken (JP); Yasuhiro Morimoto, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/121,732

(22) Filed: Apr. 15, 2002

(65) Prior Publication Data

US 2002/0163787 A1 Nov. 7, 2002

(30) Foreign Application Priority Data

May 1, 2001 (JP) ........................................ 2001-133852

(51) Int. Cl.[7] .............................. H05K 7/02; H05K 1/02; H01L 41/04
(52) U.S. Cl. ..................... 361/752; 361/736; 361/728; 361/760; 174/250; 174/260; 310/320
(58) Field of Search ................................. 361/752, 760, 361/761, 748, 736, 728; 174/250, 260; 310/320–329

(56) References Cited

U.S. PATENT DOCUMENTS

| | | | | | |
|---|---|---|---|---|---|
| 5,438,305 A | * | 8/1995 | Hikita et al. | ................. | 333/32 |
| 5,459,368 A | * | 10/1995 | Onishi et al. | ................. | 310/313 |
| 5,952,894 A | * | 9/1999 | Fukiharu | ..................... | 331/176 |
| 6,043,588 A | * | 3/2000 | Tubota et al. | ................. | 310/329 |
| 6,198,200 B1 | * | 3/2001 | Kaida et al. | ................. | 310/320 |
| 6,201,338 B1 | * | 3/2001 | Kaida et al. | ................. | 310/321 |
| 6,369,487 B1 | * | 4/2002 | Kameda et al. | ............. | 310/320 |

FOREIGN PATENT DOCUMENTS

JP     2000-286665     10/2000

* cited by examiner

*Primary Examiner*—David Martin
*Assistant Examiner*—Dameon E Levi
(74) *Attorney, Agent, or Firm*—Keating & Bennett, LLP (57) ABSTRACT

A surface mount type electronic component includes a substantially rectangular case substrate, an electronic element mounted on the case substrate along the longitudinal direction, and a cap which is fixed onto the case substrate in such a manner as to cover the electronic element. First and second top-surface electrodes and first and second bottom-surface electrodes, which extend along the width direction of the case substrate, are arranged with a spacing on the top surface and the bottom surface of the case substrate, respectively. The first top-surface electrode and the first bottom-surface electrode are connected to each other via a first side electrode disposed on the side surface of the case substrate, and the second top-surface electrode and the second bottom-surface electrode are connected to each other via a second side electrode disposed on the side surface of the case substrate.

20 Claims, 7 Drawing Sheets

SURFACE MOUNT TYPE ELECTRONIC COMPONENT

BACKGROUND OF THE INVENTION

1. Field of the Invention

The present invention relates to a surface mount type electronic component. More particularly, the present invention relates to a surface mount type electronic component in which electronic elements are mounted on a case substrate and a cap is fixed onto the case substrate so as to cover the electronic component.

2. Description of the Related Art

Recently, as the size of circuits continues to decrease, surface mount type (chip-type) electronic components have been widely used in place of components including leads. In conventional surface mount type electronic components as described in, for example, Japanese Unexamined Patent Application Publication No. 2000-286665, a piezoelectric resonance component includes a piezoelectric resonator that is mounted on a capacitor substrate and a cap that is mounted on the capacitor substrate. The capacitor substrate includes a plurality of stacked dielectric layers and first to third internal electrodes that are provided therein. The first internal electrode is provided in a different layer from those of the second and third internal electrodes, and the second and third internal electrodes are provided so as to be separated but disposed on the same layer. The first internal electrode opposes the second and third internal electrodes with a dielectric layer disposed between. First to third external electrodes are provided on the outer surface of both end portions and of the central portion of the capacitor substrate. Regarding the third external electrode provided on the outer surface of the central portion, the top surface portion thereof is omitted. The first to third external electrodes are electrically connected to the first to third internal electrodes, respectively.

In the surface mount type electronic component having the above-described structure, the first and second external electrodes provided on the top surface, the bottom surface, and the side surface of the capacitor substrate are continuous bands having the same width. That is, the spacing between the external electrodes on the top surface to which the piezoelectric element is connected and the spacing between the external electrodes on the bottom surface of a circuit substrate for mounting electronic components are the same.

However, the spacing between the external electrodes on the top surface of the capacitor substrate must be determined according to the length of the piezoelectric element mounted on the capacitor substrate, and the spacing between the external electrodes on the bottom surface of the capacitor substrate must be determined according to the land dimensions of the circuit substrate for mounting electronic components.

Recently, the length of piezoelectric elements has decreased. If, correspondingly, the spacing between external electrodes decreases, when these are mounted on a circuit substrate, problems, such as short-circuiting, occur.

If the spacing between external electrodes on the top and bottom surfaces are the same, the element length, the outside shape dimensions of the capacitor substrate and the land dimensions are limited, and a problem arises in that the degree of design freedom is greatly reduced. Additionally, the amount by which the size of electronic components can be reduced is severely limited.

SUMMARY OF THE INVENTION

In order to overcome the above-described problems, preferred embodiments of the present invention provide a surface mount type electronic component having outstanding freedom of design and a greatly reduced size.

According to a preferred embodiment of the present invention, a surface mount type electronic component includes a substantially rectangular case substrate, an electronic element mounted on the case substrate along the longitudinal direction, and a cap which is fixed to the case substrate so as to cover the electronic element, wherein first and second top-surface electrodes and first and second bottom-surface electrodes, which extend along the width direction of the case substrate, are provided and spaced apart on the top surface and the bottom surface of the case substrate, respectively, the first top-surface electrode and the first bottom-surface electrode are connected to each other via a first side electrode provided on a side surface of the case substrate, and the second top-surface electrode and the second bottom-surface electrode are connected to each other via a second side electrode provided on a side surface of the case substrate, the electronic element is electrically connected to the first and second top-surface electrodes, and the spacing d1 between the first and second top-surface electrodes differs from the spacing d2 between the first and second bottom-surface electrodes.

An electronic component is electrically connected between the first and second top-surface electrodes provided on the top surface of the case substrate. The first and second bottom-surface electrodes provided on the bottom surface of the case substrate are mounted on an electrode pad of the circuit substrate. In particular, since the spacing d1 between the top-surface electrodes of the case substrate differs from the spacing d2 between the bottom-surface electrodes, the spacing d1 of the top-surface electrodes is set to the most appropriate dimensions in accordance with the length of the electronic component, and the spacing d2 of the bottom-surface electrodes is set to the most appropriate dimensions in accordance with the spacing of the electrode pads. Therefore, the freedom of design is greatly improved, and the size is further reduced.

The spacing d1 between the first and second top-surface electrodes may be less than the spacing d2 between the first and second bottom-surface electrodes.

In preferred embodiments of the present invention, the spacings d1 and d2 are set as desired. However, the length of a piezoelectric element is often very short. If it is set that d1>d2, the spacing d2 of the bottom-surface electrodes is too small, and when piezoelectric element is mounted on a circuit substrate, short-circuiting may occur. Therefore, by setting d1<d2, short-circuiting during mounting is prevented when mounting a short, small piezoelectric element.

The side electrode preferably includes a portion which continuously extends in the thickness direction of the case substrate from the top-surface electrode at the same width as that of the top-surface electrode and a portion which continuously extends in the thickness direction of the case substrate from the bottom-surface electrode at the same width as that of the bottom-surface electrode, and both portions are preferably joined in an intermediate portion of the case substrate in the thickness direction. That is, the first and second side electrodes provided on the side surface of the case substrate are preferably step-shaped.

More specifically, since the spacing d1 between the top-surface electrodes differs from the spacing d2 between the bottom-surface electrodes, if the side electrode provided on the side surface of the case substrate is aligned with the top-surface electrode, a deviation from the bottom-surface electrode occurs at the edge of the case substrate. Similarly, if the side electrode is aligned with the bottom-surface electrode, a deviation from the top-surface electrode occurs at the edge of the case substrate. The deviation of the electrode at the edge of the case substrate decreases conduction reliability. For this reason, it is preferable that the electrodes provided on adjacent surfaces with an edge in between have substantially the same width.

Accordingly, by joining, in an intermediate portion of the case substrate in the thickness direction, a portion of the side electrode, which continuously extends along the thickness direction of the case substrate from the top-surface electrode at the same width as that of the top-surface electrode, and a portion of the side electrode, which continuously extends along the thickness direction of the case substrate from the bottom-surface electrode at the same width as that of the bottom-surface electrode, the electrode deviation at the edge is eliminated, and thus the conduction reliability of the electrodes on the top and upper surfaces is greatly improved.

The electronic element may be a piezoelectric element. The case substrate preferably includes two capacitors incorporated therein. A third electrode is preferably provided between the first and second bottom-surface electrodes. One of the capacitors is connected between one of the first top-surface electrode and the first bottom-surface electrode, and the third electrode, and the other capacitor is connected between one of the second top-surface electrode and the second bottom-surface electrode, and the third electrode.

More specifically, in a Colpitts oscillation circuit, a phase compensating capacitor is connected between one of the electrodes of the piezoelectric element and the ground and between the other electrode and the ground. In the present preferred embodiment of the present invention, by incorporating these capacitors in the case substrate, a compact piezoelectric resonator for an oscillation circuit is obtained.

The case substrate preferably includes a plurality of stacked dielectric layers having internal electrodes provided thereon, or a chip-type capacitor may be provided separately.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
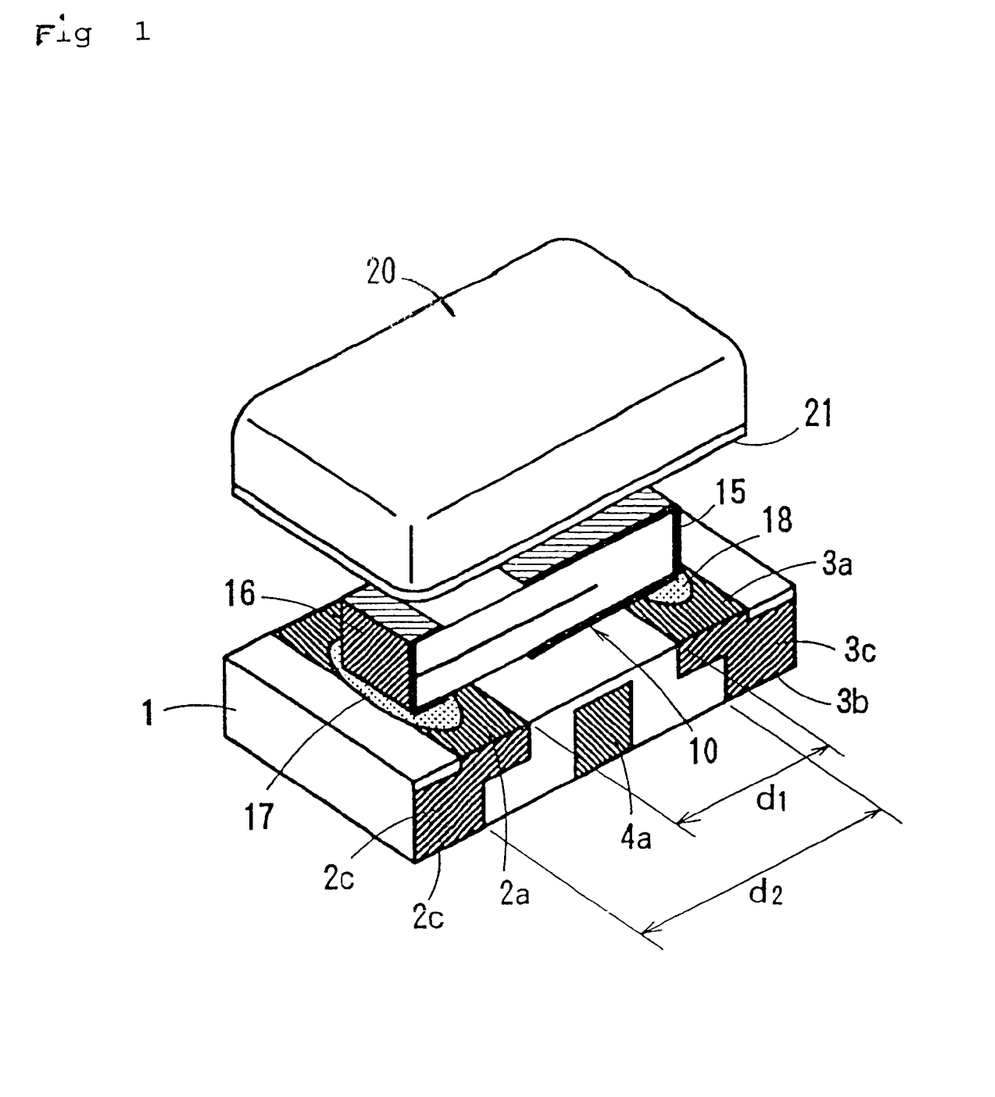
FIG. 1 is a perspective view of a preferred embodiment of a surface mount type electronic component according to the present invention.
Figure 2A:
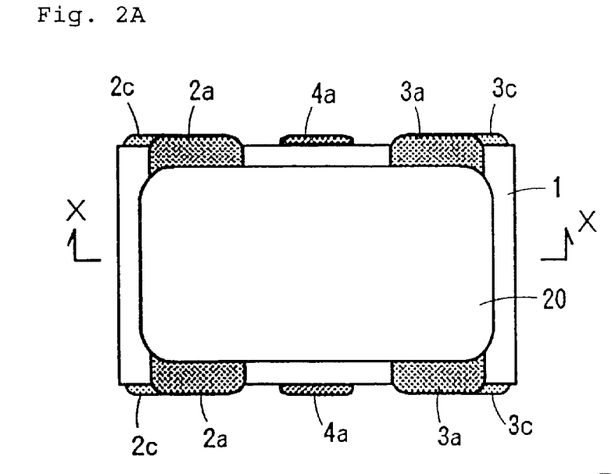
FIG. 2A is a plan view of the exterior of an electronic component shown in FIG. 1.
Figure 2B:
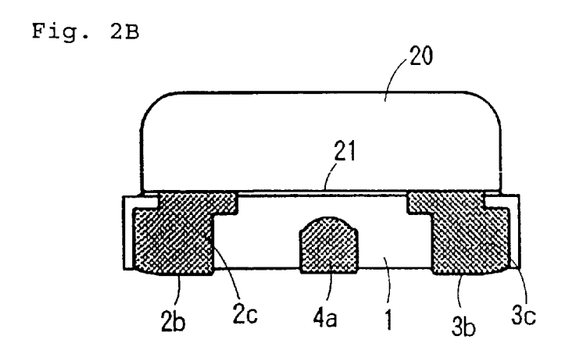
FIG. 2B is a front view thereof.
Figure 2C:
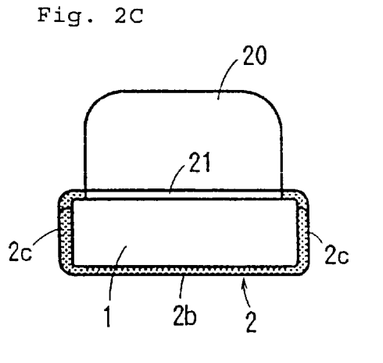
FIG. 2C is a side view thereof.
Figure 3:
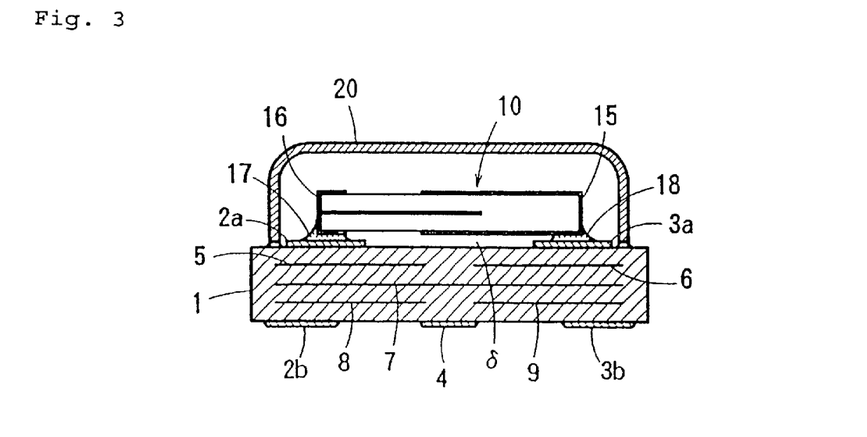
FIG. 3 is a side view along the X–X' line in FIG. 2.

FIGS. 1 to 3 show a piezoelectric resonator component as an example of a surface mount type electronic component according to a preferred embodiment of the present invention.

The piezoelectric resonator component preferably includes an energy-trap-type piezoelectric element 10 mounted on a case substrate 1 and a metal cap 20 bonded onto the case substrate 1 to surround and seal the piezoelectric element 10.

Figure 4:
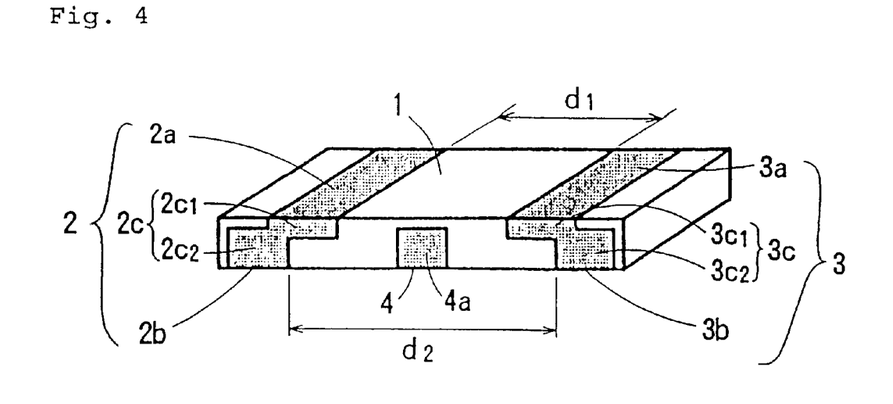
FIG. 4 is a perspective view of a case substrate used for the electronic component shown in FIG. 1.
Figure 5:
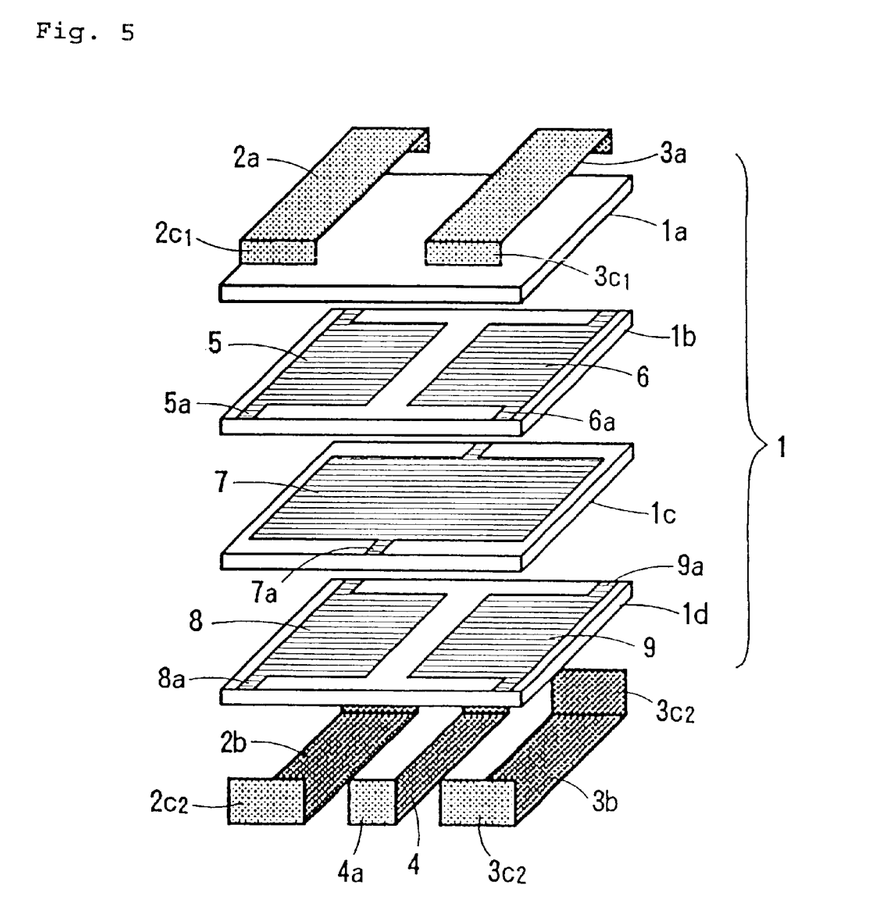
FIG. 5 is an exploded perspective view of the case substrate shown in FIG. 4.

The case substrate 1 includes a plurality of stacked dielectric ceramic layers having no piezoelectric properties, and having a substantially rectangular shape. As shown in FIGS. 4 and 5, first and second external electrodes 2 and 3 defining output electrodes, and an external electrode 4 defining grounding electrode are provided on the outer surface of the case substrate 1. Particularly, on the top surface of the case substrate 1, band-shaped top-surface electrodes $2a$ and $3a$ which extend in the width direction are provided at a spacing d1 in the longitudinal direction, and band-shaped bottom-surface electrodes $2b$ and $3b$ which extend in the width direction are provided at a spacing d2 in the longitudinal direction. The top-surface electrodes $2a$ and $3a$ are connected to the bottom-surface electrodes $2b$ and $3b$ via side electrodes $2c$ and $3c$, respectively. First and second external electrodes 2 and 3 wrap around the case substrate 1 to form a band. All of the top-surface electrodes $2a$ and $3a$ and the bottom-surface electrodes $2b$ and $3b$ have a constant width. The top-surface electrodes $2a$ and $3a$ and the bottom-surface electrodes $2b$ and $3b$ have the same width, and partially oppose each other with the case substrate 1 therebetween. The spacing d1 between the top-surface electrodes $2a$ and $3a$ is less than the spacing d2 between the bottom-surface electrodes $2b$ and $3b$, such that d1<d2.

Therefore, the spacing d1 between the top-surface electrodes $2a$ and $3a$ is set to the most appropriate dimensions according to the length of the piezoelectric element 10 which is mounted in the space between the top-surface electrodes $2a$ and $3a$, and the spacing d2 between the bottom-surface electrodes $2b$ and $3b$ is set to the most appropriate dimensions according to the spacing of electrode pads of a circuit substrate on which this piezoelectric resonator component is mounted.

The side electrodes $2c$ and $3c$ have a stepped shape when viewed in a side view. That is, the side electrode $2c$ has a portion $2c_1$ which extends continuously in the thickness direction of the case substrate 1 from the top-surface electrode $2a$ at the same width as that of the top-surface electrode $2a$ and a portion $2c_2$ which extends continuously in the thickness direction of the case substrate 1 from the bottom-surface electrode $2b$ at the same width as that of the bottom-surface electrode $2b$, and the portions $2c_1$ and $2c_2$ are joined in an intermediate portion of the case substrate 1 in the thickness direction.

Similarly, the side electrode $3c$ has a portion $3c_1$ which extends continuously in the thickness direction of the case substrate 1 from the top-surface electrode 3a at the same width as that of the top-surface electrode 3a and a portion $3c_2$ which extends continuously in the thickness direction of the case substrate 1 from the bottom-surface electrode 3b at the same width as that of the bottom-surface electrode 3b, and the portions $3c_1$ and $3c_2$ are joined in an intermediate portion of the case substrate 1 in the thickness direction.

A third external electrode 4, which defines a grounding electrode, extends continuously from the bottom surface of the case substrate 1 to a portion of the side surface thereof. The third external electrode 4 may also extend around a port on the top surface of the case substrate 1.

Within the case substrate 1, as shown in FIG. 5, a plurality of capacitor electrodes 5 to 9 are provided. That is, the case substrate 1 is defined by four dielectric layers 1a to 1d. A capacitor electrode is not provided on the dielectric layer 1a. Two separate capacitor electrodes 5 and 6 are provided on the second layer 1b. One wide-area capacitor electrode 7 is provided on the third layer 1c. Two separate capacitor electrodes 8 and 9 are provided on the fourth layer 1d. The capacitor electrodes 5 and 6 and the capacitor electrodes 8 and 9 have substantially the same shape. In both end portions of the capacitor electrodes 5 to 9 along the width direction, extension portions 5a to 9a, which are exposed on the side surface of the longer side of the case substrate 1, are provided. The extension portions 5a and 8a of the capacitor electrodes 5 and 8 are connected to the side electrode 2c of the first electrode 2, and the extension portions 6a and 9a of the capacitor electrodes 6 and 9 are connected to the side electrode 3c of the second electrode 3. Furthermore, the extension portion 7a of the capacitor electrode 7 is connected to the side electrode 4a of the third electrode 4.

Figure 6:
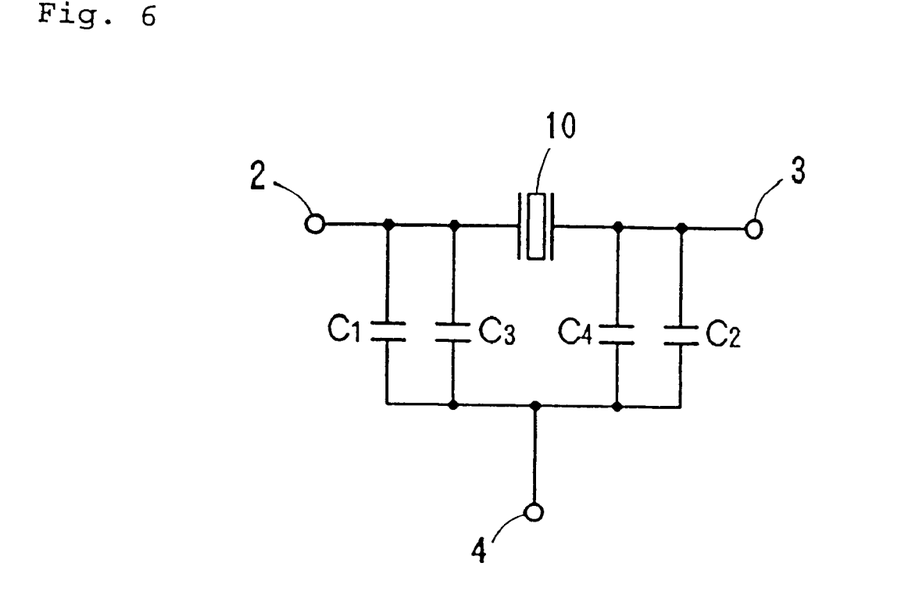
FIG. 6 is a circuit diagram of the electronic component shown in FIG. 1.

Therefore, as shown in FIG. 6, capacitors C1 and C2 are provided between the capacitor electrodes 5 and 6, and the capacitor electrode 7, which partially oppose each other, with the second layer 1b therebetween, and capacitors C3 and C4 are provided between the capacitor electrodes 8 and 9, and the capacitor electrode 7, which partially oppose each other, with the third layer 1c therebetween.

Although in this preferred embodiment, the case substrate 1 is defined by four dielectric layers 1a to 1d, and the capacitor electrodes 5 to 9 of three layers are provided therein, the present invention is not limited to this. For example, the dielectric layers have a three-layer structure (capacitor electrodes are provided on a two-layer structure), or the dielectric layers may be five or more layers (capacitor electrodes are provided on four or more layers), and this is determined according to phase compensating characteristics.

Figure 7:
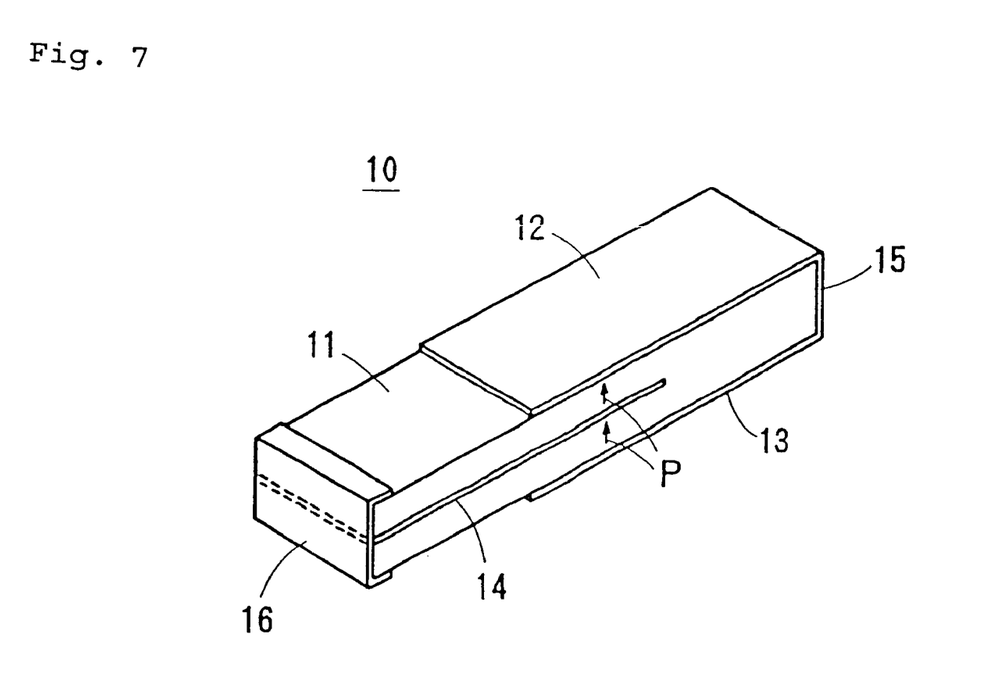
FIG. 7 is a perspective view of a piezoelectric element mounted in the electronic component shown in FIG. 1.

The piezoelectric element 10, as shown in FIG. 7, is a piezoelectric resonator using a harmonic wave of a thickness extensional vibration mode. The piezoelectric element 10 includes a piezoelectric substance 11 made of piezoelectric ceramic and having a strip rectangular shape, first and second excitation electrodes 12 and 13 provided on the front surface and the rear surface of the piezoelectric substance 11 and which extend from one end of the piezoelectric substance 11 along the longitudinal direction to a central portion thereof, and an internal electrode 14 provided inside the piezoelectric substance 11 which extends from the other end of the piezoelectric substance 11 along the longitudinal direction to a central portion thereof. The excitation electrodes 12 and 13, and the internal electrode 14 partially oppose each other. On both end surfaces of the piezoelectric substance 11 along the longitudinal direction, end-surface electrodes 15 and 16 are provided, one of the end-surface electrodes 15 being connected to the excitation electrodes 12 and 13 and the other end-surface electrode 16 being connected to the internal electrode 14. The end-surface electrode 16 extends partially around the front and rear surfaces of the piezoelectric substance 11.

The piezoelectric substance 11 is polarized in the thickness direction as indicated by the arrow P in FIG. 7, and when a predetermined signal is input between the end-surface electrodes 15 and 16, a harmonic wave of a thickness extensional vibration having a small amount of spurious radiation is excited.

As shown in FIGS. 1 and 3, the piezoelectric element 10 is arranged on the case substrate 1 such that the longitudinal direction thereof is substantially parallel to the direction of the longer side of the case substrate 1. The end-surface electrodes 15 and 16 are electrically connected and mechanically fixed to the top-surface electrodes 2a and 3a of the case substrate 1, respectively, via conductive bonding materials 17 and 18, such as, a conductive adhesive or a solder. A desired clearance δ is provided between the central portion of the piezoelectric element 10 and the case substrate 1 such that the vibration of the piezoelectric element 10 is not inhibited (see FIG. 3).

The cap 20 is preferably formed by press-molding a metal plate, and an insulating adhesive 21 is coated in the opening thereof by a transfer method. After the piezoelectric element 10 is mounted on the case substrate 1, the cap 20 is bonded and fixed to the top surface of the case substrate 1 so as to cover the piezoelectric element 10. A thermosetting epoxy adhesive may be used for the adhesive 21.

After the cap 20 is bonded and fixed by the insulating adhesive 21, the cap 20 and the grounding electrode 4 are connected to each other via a conductive adhesive so as to form a shielded structure.

Although the cap 20 of this preferred embodiment is formed by press-molding a metal plate, a resin cap or a ceramic cap may be used.

A method of manufacturing the case substrate 1 of the above-described preferred embodiment will now be described with reference to FIG. 8.

Figure 8A:
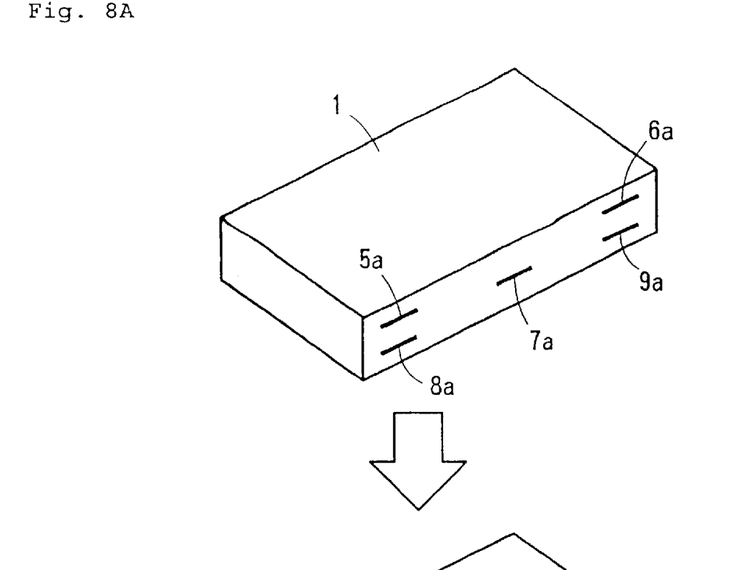
FIG. 8 is a perspective view showing steps of manufacturing the case substrate shown in FIG. 4.

Initially, as shown FIG. 8(a), the case is obtained by stacking four dielectric layers 1a to 1d (see FIG. 5), in which capacitor electrodes 5 to 9 are provided and by firing the four stacked dielectric layers 1a to 1d. On a side surface of the longer side of the case substrate 1, the extension portions 5a to 9a of the capacitor electrodes 5 to 9 are exposed.

In order to expose the extension portions 5a to 9a, the side surface of the case substrate 1 is polished, and in order to improve the electrical conduction with the side electrodes 2c, 3c, and 4 (to be described later), the side surface of the case substrate 1 is roughened by sandblasting or barreling.

Figure 8B:
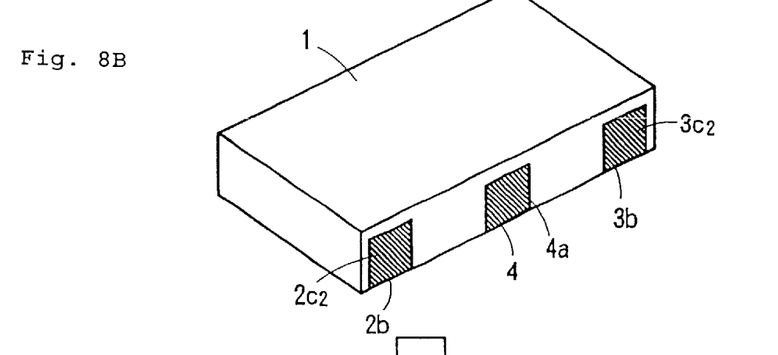

Next, as shown FIG. 8(b), the bottom-surface electrodes 2b, 3b, and 4, and the side electrode portions $2c_2$, $3c_2$, and 4a continuously extend from the bottom surface of the case substrate 1 to the side surface, and the side electrode portions $2c_2$, $3c_2$, and 4a cover the extension portions 5a to 9a of the capacitor electrodes 5 to 9, exposed on the side surface of the case substrate 1. The method of forming electrodes is shown in FIGS. 9A, 9B, and 9C. As shown in FIG. 9A, a plurality of grooves G1 to G3 are formed on a paste-coated plate A having rubber elasticity, and these grooves G1 to G3 are filled with a conductive paste S so as to be flush with the surface of the paste-coated plate A. Next, as shown in FIG. 9B, the case substrate 1 is pressed from above the coated plate A in order to flex the coated plate A. At this time, some of the paste S within the grooves G1 to G3 flows around the side surface of the case substrate 1 as a result of being pressed against the bottom surface of the case substrate 1. Thereafter, as shown in FIG. 9C, when the case substrate 1 is lifted from the coated plate A, the paste S is continuously coated from the bottom surface of the case substrate 1 to the side surface. Since the amount of paste S remaining in the grooves G1 to G3 of the coated plate A after one coating is finished is small, the paste S is provided the top surface of the coated plate A for the next coating, and squeezing is performed, and thus the state is returned to the state of FIG. 9A.

With the method shown in FIGS. 9A, 9B, and 9C, the electrode which is continuous from one main surface of the case substrate 1 to the side surface is formed in one operation.

Figure 8C:
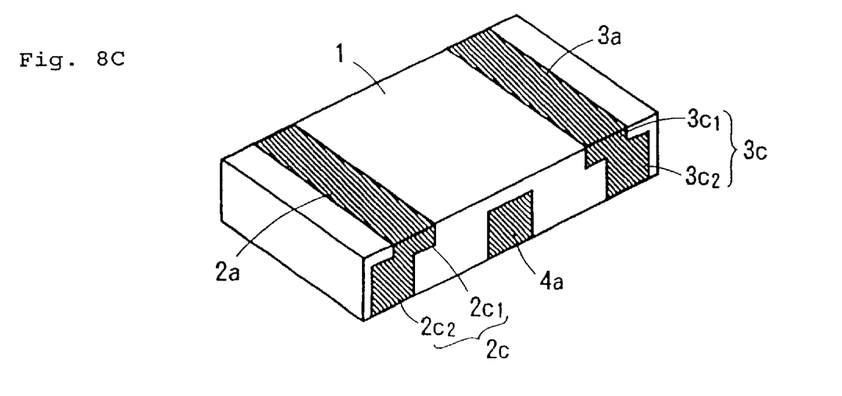
Figure 9A:
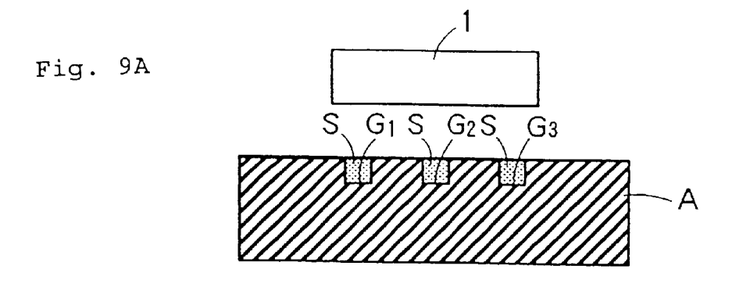
FIGS. 9A, 9B, and 9C are process diagrams showing a method of manufacturing an electrode of the case substrate shown in FIG. 4.
Figure 9B:
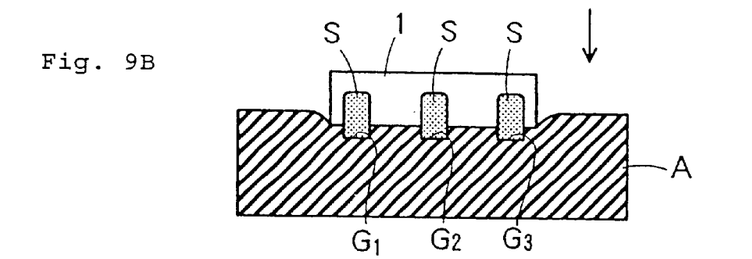
Figure 9C:
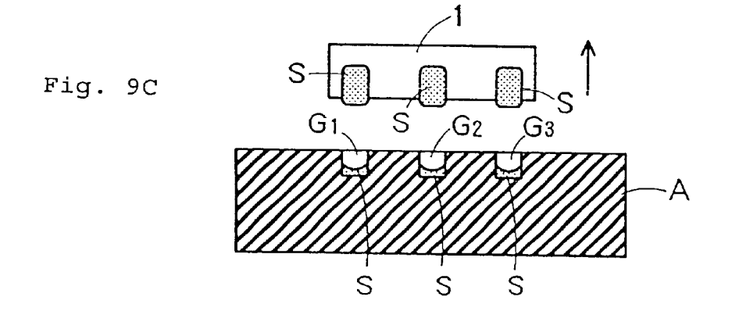

The case substrate 1 on which the electrode is formed continuously from the bottom surface to the side surface in the manner described above is turned over, and the method similar to that described above is used to form the electrodes 2a and 3a which are continuous from the top surface of the case substrate 1 to the side surface, and the side electrode portions $2c_1$ and $3c_1$ (see FIG. 8(c)). At this time, it is important that the side electrode portions $2c_1$ and $3c_1$ are joined to the side electrode portions $2c_2$ and $3c_2$. The coated plate used herein, unlike the coated plate A shown in FIGS. 9A, 9B, and 9C, includes two grooves, and the spacing d1 between the grooves is narrower than the spacing d2 between the grooves G1 and G3 of the coated plate A. As a result, the side electrodes 2c and 3c having a stepped shape are formed on the side surface of the case substrate 1.

Figure 10:
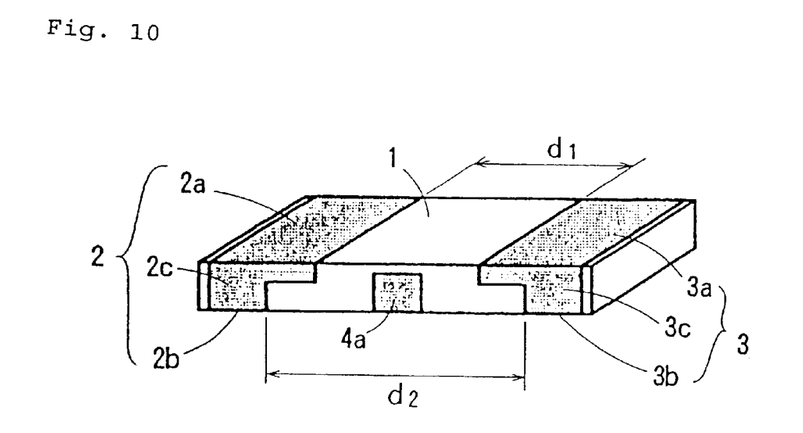
FIG. 10 is a perspective view of another preferred embodiment of a case substrate according to the present invention.
Figure 11A:
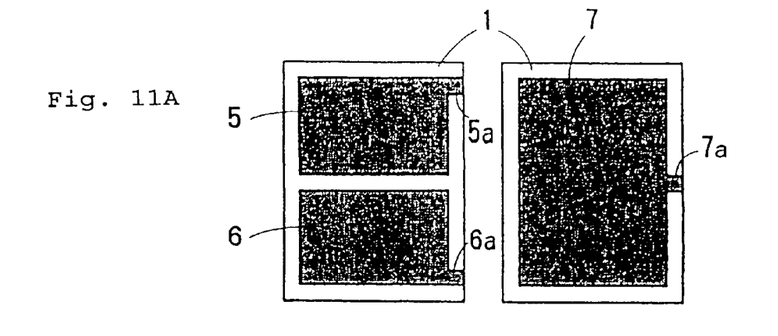
FIGS. 11A, 11B, 11C, and 11D are plan views showing examples of patterns of a capacitor electrode provided inside the case substrate.
Figure 11B:
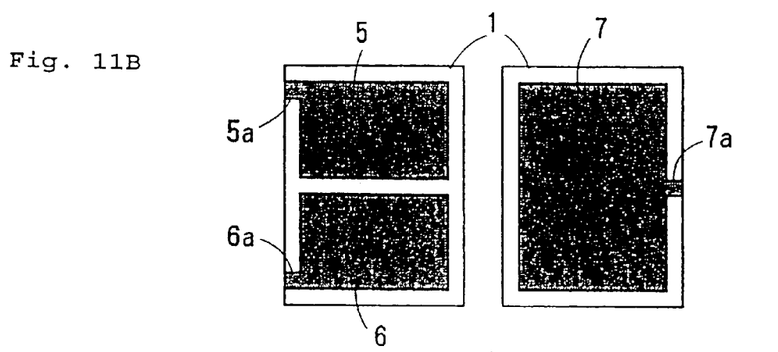
Figure 11C:
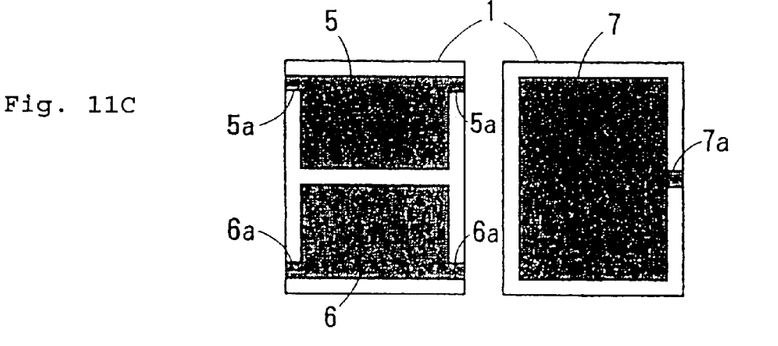
Figure 11D:
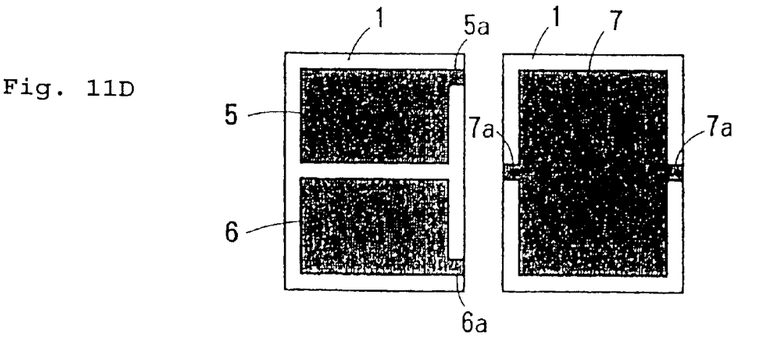

FIG. 10 shows a second preferred embodiment of a case substrate. Components of the case substrate 1 of the second preferred embodiment that are the same as those of the case substrate 1 of the first preferred embodiment are given the same reference numeral, and accordingly, duplicate descriptions thereof are omitted.

In the case substrate 1 of the second preferred embodiment, the widths of the top-surface electrodes 2a and 3a are greater than those of the bottom-surface electrodes 2b and 3b. However, the spacing d1 between the top-surface electrodes 2a and 3a is less than the spacing d2 between the bottom-surface electrodes 2b and 3b.

In the case according to the second preferred embodiment, the step difference from the top-surface electrodes 2a and 3a is reduced in the cap bonded portion of the top surface of the case substrate 1, and thus, the sealing properties of the cap 20 are improved.

FIGS. 11A, 11B, 11C, and 11D show various patterns of capacitor electrodes provided inside the case substrate 1.

In this preferred embodiment, at least one portion from each of the extension portions 5a, 6a, and 7a of the capacitor electrodes 5 and 6 on the input and output sides and the capacitor electrode 7 on the grounding side are exposed on only one side surface of the case substrate 1.

In particular, when the extension portions 5a and 6a on the input and output sides are exposed on only one side surface of the case substrate 1, a closed loop is not provided between the extension portions 5a and 6a and the side electrodes 2c and 3c (not shown) to be connected, and stray inductance does not occur. Consequently, when the electronic element is used as an oscillation element, the characteristics are greatly improved.

Although in the above-described preferred embodiments, a multilayered substrate made of dielectric material is used as the case substrate, the case substrate may be made of glass, ceramic, glass epoxy resin, or heat-resistant resin, or other suitable material. Therefore, the case substrate is not limited to a case substrate in which capacitors are incorporated.

The electronic elements used in the present invention are not necessarily piezoelectric elements of the thickness extensional vibration mode, such as those of the above-described preferred embodiments, and may be piezoelectric elements of the thickness shear vibration mode, and furthermore, may be electronic elements other than piezoelectric elements.

Although in the above-described preferred embodiments, the spacing d1 between the top-surface electrodes is less than the spacing d2 between the bottom-surface electrodes, conversely, the spacing d1 between the top-surface electrodes may be greater than the spacing d2 between the bottom-surface electrodes.

While the present invention has been described with reference to what are at present considered to be preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A surface mount type electronic component comprising:

a case substrate having a longitudinal direction and a width direction;

an electronic element mounted on said case substrate along the longitudinal direction; and a cap fixed to said case substrate so as to cover said electronic element;

wherein first and second top-surface electrodes and first and second bottom-surface electrodes, which extend along the width direction of the case substrate, are provided on the top surface and the bottom surface of said case substrate and spaced from one another, respectively, the first top-surface electrode and the first bottom-surface electrode are connected to each other via a first side electrode provided on a side surface of the case substrate, and the second top-surface electrode and the second bottom-surface electrode are connected to each other via a second side electrode provided on a side surface of the case substrate, said electronic element is electrically connected to the first and second top-surface electrodes, and a space d1 between the first and second top-surface electrodes differs from a space d2 between the first and second bottom-surface electrodes.

2. A surface mount type electronic component according to claim 1, wherein the space d1 between the first and second top-surface electrodes is less than the space d2 between the first and second bottom-surface electrodes.

3. A surface mount type electronic component according to claim 1, wherein said side electrode includes a first portion which extends continuously in the thickness direction of the case substrate from the top-surface electrode and has substantially the same width as that of the top-surface electrode and a second portion which extends continuously in the thickness direction of the case substrate from the bottom-surface electrode and has substantially the same width as that of the bottom-surface electrode, and said first and second portions are joined in an intermediate portion of the case substrate along the thickness direction.

4. A surface mount type electronic component according to claim 1, wherein said electronic element is a piezoelectric element, said case substrate is a substrate having capacitors incorporated therein, a third electrode is provided between the first and second bottom-surface electrodes, and one of the capacitors is connected between one of the first top-surface electrode and the first bottom-surface electrode, and the third electrode, and another of the capacitors is connected between one of the second top-surface electrode and the second bottom-surface electrode, and the third electrode.

5. A surface mount type electronic component according to claim 1, wherein said case substrate is defined by a plurality of stacked ceramic layers.

6. A surface mount type electronic component according to claim 5, wherein at least two capacitor electrodes are provided on one of the plurality of stacked ceramic layers, and another capacitor electrode is provided on another of the plurality of stacked ceramic layers to partially oppose said at least two capacitor electrodes.

7. A surface mount type electronic component according to claim 1, wherein said electronic element is a piezoelectric element that is polarized to utilize a harmonic wave of a thickness extensional vibration mode.

8. A surface mount type electronic component according to claim 1, further comprising an insulating adhesive provided between the cap and the case substrate to fix the cap to the case substrate.

9. A surface mount type electronic component according to claim 8, wherein the insulating adhesive is a thermosetting epoxy adhesive.

10. A surface mount type electronic component according to claim 1, wherein the cap is a press-molded metal plate.

11. A surface mount type electronic component comprising:

a case substrate having a longitudinal direction and a width direction;

an electronic element mounted on said case substrate along the longitudinal direction; and a cap fixed to said case substrate so as to cover said electronic element;

wherein first and second top-surface electrodes and first and second bottom-surface electrodes, which extend along the width direction of the case substrate, are provided on the top surface and the bottom surface of said case substrate and spaced from one another, respectively, said electronic element is electrically connected to the first and second top-surface electrodes, and a space d1 between the first and second top-surface electrodes differs from a space d2 between the first and second bottom-surface electrodes.

12. A surface mount type electronic component according to claim 11, further comprising first and second side electrodes, wherein the first top-surface electrode and the first bottom-surface electrode are connected to each other via the first side electrode provided on a side surface of the case substrate, and the second top-surface electrode and the second bottom-surface electrode are connected to each other via the second side electrode provided on a side surface of the case substrate.

13. A surface mount type electronic component according to claim 11, wherein the space d1 between the first and second top-surface electrodes is less than the space d2 between the first and second bottom-surface electrodes.

14. A surface mount type electronic component according to claim 12, wherein said first side electrode includes a first portion which extends continuously in the thickness direction of the case substrate from the top-surface electrode and has substantially the same width as that of the top-surface electrode, and a second portion which extends continuously in the thickness direction of the case substrate from the bottom-surface electrode and has substantially the same width as that of the bottom-surface electrode, and said first and second portions are joined in an intermediate portion of the case substrate along the thickness direction.

15. A surface mount type electronic component according to claim 11, wherein said electronic element is a piezoelectric element, said case substrate is a substrate having capacitors incorporated therein, a third electrode is provided between the first and second bottom-surface electrodes, and one of the capacitors is connected between one of the first top-surface electrode and the first bottom-surface electrode, and the third electrode, and another of the capacitors is connected between one of the second top-surface electrode and the second bottom-surface electrode, and the third electrode.

16. A surface mount type electronic component according to claim 11, wherein said case substrate is defined by a plurality of stacked ceramic layers.

17. A surface mount type electronic component according to claim 16, wherein at least two capacitor electrodes are provided on one of the plurality of stacked ceramic layers, and another capacitor electrode is provided on another of the plurality of stacked ceramic layers to partially oppose said at least two capacitor electrodes.

18. A surface mount type electronic component according to claim 11, wherein said electronic element is a piezoelectric element that is polarized to utilize a harmonic wave of a thickness extensional vibration mode.

19. A surface mount type electronic component according to claim 11, further comprising an insulating adhesive provided between the cap and the case substrate to fix the cap to the case substrate.

20. A surface mount type electronic component according to claim 19, wherein the insulating adhesive is a thermosetting epoxy adhesive.

* * * * *